(12) United States Patent  
Seo et al.

(10) Patent No.: US 12,004,436 B2
(45) Date of Patent: Jun. 4, 2024

(54) RRAM WITH HIGH WORK FUNCTION CAP

(71) Applicant: INTERNATIONAL BUSINESS MACHINES CORPORATION, Armonk, NY (US)

(72) Inventors: Soon-Cheon Seo, Glenmont, NY (US); Min Gyu Sung, Latham, NY (US); Takashi Ando, Eastchester, NY (US); Chanro Park, Clifton Park, NY (US); Mary Claire Micaller Silvestre, Clifton Park, NY (US); Xuefeng Liu, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 17/815,582

(22) Filed: Jul. 28, 2022

(65) Prior Publication Data
US 2024/0040940 A1 Feb. 1, 2024

(51) Int. Cl.
*H10N 70/00* (2023.01)
*H10B 63/00* (2023.01)

(52) U.S. Cl.
CPC ......... *H10N 70/8833* (2023.02); *H10B 63/80* (2023.02); *H10N 70/023* (2023.02);
(Continued)

(58) Field of Classification Search
CPC ............. H10N 70/826; H10N 70/8833; H10N 70/063; H10N 70/24; H10N 70/841; H10N 70/011; H10N 70/021; H10N 70/023; H10N 70/20; H10N 70/8836; H10N 70/8418; H10N 70/066; H10N 70/068; H10N 70/253; H10N 70/8416; H10N 70/231; H10N 70/883; H10N 70/061; H10N 70/801; H10N 70/821; H10N 70/8413; H10N 70/245;
(Continued)

(56) References Cited

U.S. PATENT DOCUMENTS 8,959,250 B2  2/2015  Lee
9,306,162 B2  4/2016  Sills
(Continued)

FOREIGN PATENT DOCUMENTS

WO  2018004697 A1  1/2018
WO  2019066769 A1  4/2019

OTHER PUBLICATIONS

Disclosed Anonymously, "Method and Structure for Back-End-Of-Line (BEOL) Fat Wire Level Ground Rule Compatible Embedded Memory Integration", Sep. 11, 2019, IP.com No. IPCOM000259732D, 6 pages.
(Continued)

*Primary Examiner* — Thong Q Le
(74) *Attorney, Agent, or Firm* — Yuanmin Cai

(57) ABSTRACT

Embodiments of present invention provide a resistive random-access memory (RRAM) cell. The RRAM cell includes a bottom electrode; a metal oxide layer, the metal oxide layer having a central portion that is in direct contact with the bottom electrode, a peripheral portion that is nonplanar with the central portion, and a vertical portion between the central portion and the peripheral portion; and a top electrode directly above the metal oxide layer. A method of manufacturing the RRAM cell is also provided.

12 Claims, 8 Drawing Sheets

(52) U.S. Cl.
CPC ......... *H10N 70/063* (2023.02); *H10N 70/066* (2023.02); *H10N 70/841* (2023.02)

(58) Field of Classification Search
CPC ............. H10N 70/8265; H10N 70/828; H10N 70/8845; G11C 13/0007; G11C 2213/52; G11C 2213/32; G11C 13/003; G11C 13/0038; G11C 13/0069; G11C 2013/0073; G11C 2013/008; G11C 2013/0083; G11C 2213/14; G11C 2213/31
See application file for complete search history.

(56) References Cited

U.S. PATENT DOCUMENTS

| | | |
|---|---|---|
| 9,577,191 B2 | 2/2017 | Dang |
| 9,577,192 B2 | 2/2017 | Balakrishnan |
| 10,388,869 B2 | 8/2019 | Majhi |
| 10,700,281 B2 | 6/2020 | Wang |
| 10,916,699 B2 | 2/2021 | Ando |
| 2008/0185572 A1 | 8/2008 | Chiang |
| 2013/0224888 A1 | 8/2013 | Nagashima |
| 2015/0311435 A1 | 10/2015 | Liu |
| 2019/0165269 A1 | 5/2019 | Ando |
| 2020/0287136 A1 | 9/2020 | Li |
| 2021/0013408 A1* | 1/2021 | Pai ................. H10N 70/841 |

OTHER PUBLICATIONS

Hayakawa et al., "Highly reliable TaOx ReRAM with centralized filament for 28-nm embedded application", 2015 Symposium on VLSI Technology Digest of Technical Papers, pp. T14-T15.

Notification of Transmittal of the International Search Report and the Written Opinion of the International Searching Authority, or the Declaration, date of mailing Sep. 28, 2023, International application No. PCT/IB2023/055574, 14 pages.

* cited by examiner

RRAM WITH HIGH WORK FUNCTION CAP

BACKGROUND

The present application relates to manufacturing of semiconductor integrated circuits. More particularly, it relates to a resistive random-access memory cell and method of manufacturing the same.

With the explosion of digital information, semiconductor memories are playing an ever increasingly important role in the overall integrated circuit industry. Ideally, semiconductor memories should preferably possess the following characteristics including random accessibility, non-volatile, increased capacity, increased speed, reduced power consumption, and unlimited reading and writing functions. Among the various types of memories, resistive random-access memory (RRAM) has been recognized as having exhibited the aforementioned characteristics or advantages as a semiconductor memory.

Most recently, high work function metals that provide good oxidation resistance have been used in forming RRAM cells. The use of high work function metals such as, for example, ruthenium (Ru) and platinum (Pt), affords the RRAM cells with lower forming voltage, lower switching voltage, and increased Ion/Ioff ratio. On the other hand, the relatively high cost of these high work function metals such as Ru and Pt makes RRAM more expensive, particularly when the RRAM are manufactured with currently existing processes. For example, most of the currently existing processes applies a chemical-mechanic-polishing (CMP) process in handling the high work function metals resulting in significant waste of these precious high work function metals.

SUMMARY

Embodiments of present invention provide a resistive random-access memory (RRAM) cell. The RRAM cell includes a bottom electrode; a metal oxide layer where the metal oxide layer includes a central portion that is in direct contact with the bottom electrode, a peripheral portion that is nonplanar with the central portion, and a vertical portion between the central portion and the peripheral portion; and a top electrode directly above the metal oxide layer.

In one embodiment, the bottom electrode has a top surface, a bottom surface, and a sidewall between the top surface and the bottom surface, where the sidewall of the bottom electrode is surrounded by the vertical portion of the metal oxide layer.

In another embodiment, the peripheral portion of the metal oxide layer has a bottom surface, and the bottom surface of the peripheral portion of the metal oxide layer is coplanar with the bottom surface of the bottom electrode.

In one embodiment, the top electrode is on top of the central portion and the peripheral portion of the metal oxide layer and is directly adjacent to an outer surface of the vertical portion of the metal oxide layer.

In one embodiment, the RRAM cell further includes a bottom contact stud in contact with the bottom electrode, and the bottom contact stud is surrounded by a dielectric layer and has a top surface of a same size as a bottom surface of the bottom electrode.

In another embodiment, the RRAM cell further includes a dielectric layer, where an outer surface of the vertical portion of the metal oxide layer is directly adjacent to the dielectric layer.

In one embodiment, the bottom electrode has a first thickness and the dielectric layer has a second thickness, and wherein the first thickness is less than the second thickness.

In another embodiment, a portion of the top electrode is in direct contact with an inner surface of the vertical portion of the metal oxide layer and is horizontally surrounded by the dielectric layer.

In yet another embodiment, the peripheral portion of the metal oxide layer is directly above the dielectric layer and the central portion of the metal oxide layer is at a level below a top surface of the dielectric layer.

Embodiments of present invention also provide a method of forming a semiconductor structure such as a RRAM cell. The method includes receiving a contact structure having a contact area; forming a bottom electrode on top of the contact area; forming a metal oxide layer, the metal oxide layer having a central portion directly above and in contact with the bottom electrode and a peripheral portion above a dielectric layer, wherein the peripheral portion of the metal oxide layer is nonplanar with the central portion of the metal oxide layer; forming a top electrode layer above the metal oxide layer; and patterning the top electrode layer and the metal oxide layer.

In one embodiment, the contact structure is a bottom contact stud surrounded by the dielectric layer, and forming the bottom electrode includes selectively forming the bottom electrode only on top of the contact area and not on the dielectric layer surrounding the bottom contact stud.

In another embodiment, forming the metal oxide layer includes forming the central portion of the metal oxide layer on top of the bottom electrode and forming the peripheral portion of the metal oxide layer surrounding a sidewall of the bottom electrode.

In one embodiment, the dielectric layer is above the contact structure and has an opening exposing the contact area of the contact structure, and forming the bottom electrode includes selectively forming the bottom electrode on top of the exposed contact area inside the opening, the bottom electrode being surrounded by the dielectric layer.

In another embodiment, forming the metal oxide layer includes forming the central portion of the metal oxide layer directly on top of the bottom electrode inside the opening and the peripheral portion of the metal oxide on top of the dielectric layer outside the opening.

BRIEF DESCRIPTION OF THE DRAWINGS

The present invention will be understood and appreciated more fully from the following detailed description of embodiments of present invention, taken in conjunction with accompanying drawings of which.

Figure 1:
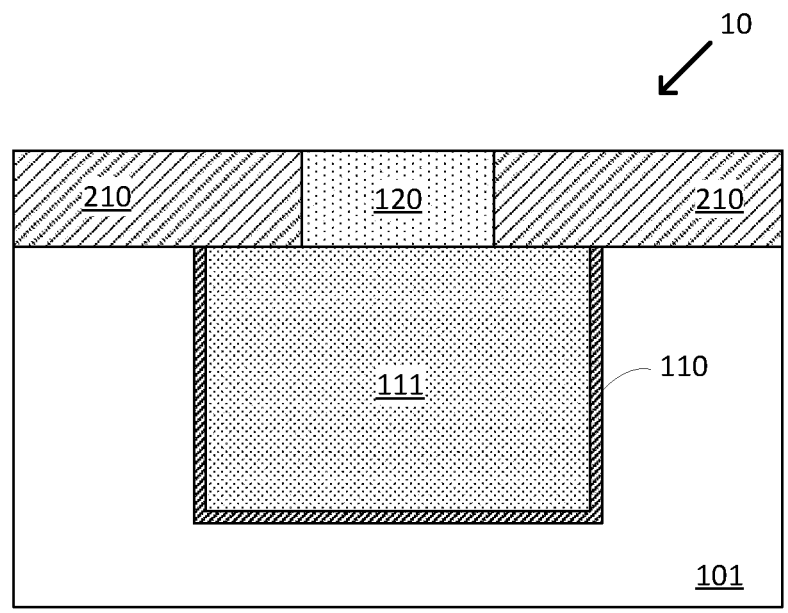
FIGS. 1-6 are demonstrative illustrations of cross-sectional views of a RRAM cell in a process of manufacturing thereof according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1-6 are demonstrative illustrations of cross-sectional views of a RRAM cell in a process of manufacturing thereof according to one embodiment of present invention. More particularly, in forming a RRAM cell 10, embodiments of present invention provide receiving a contact structure such as, for example, a bottom contact metal 111 embedded in a supporting structure such as, for example, an interlevel-dielectric (ILD) layer 101 on top of a semiconductor substrate (not shown). In one embodiment, the bottom contact metal 111 may be a metal level such as, for example, M2, M3, etc. of a back-end-of-line (BEOL) structure. The bottom contact metal 111 may be copper (Cu), tungsten (W), or other suitable conductive materials. The ILD layer 101 may be silicon-oxide (SiO, SiO2), silicon-carbon-oxide (SiCO, SiCOH), or other suitable low-k dielectric materials, and may be part of a larger ILD layer that includes other non-RRAM regions containing other passive and/or active semiconductor elements. The bottom contact metal 111 may be embedded in the ILD layer 101 with a liner 110 in-between.

As being demonstratively illustrated in FIG. 1, embodiments of present invention provide forming a first dielectric layer 210 on top of the bottom contact metal 111 and the ILD layer 101 and forming a bottom contact stud 120 embedded in the first dielectric layer 210 in direct contact with the bottom contact metal 111. In one embodiment, the first dielectric layer 210 may be silicon-nitride (SiN), silicon-carbon-nitride (SiCN, SiCHN) or a combination of SiN/SiCHN, and may be formed through, for example, an atomic-layer-deposition (ALD) process or chemical-vapor-deposition (CVD) process to have a thickness ranging from about 10 nm to about 100 nm.

In forming the bottom contact stud 120, embodiments of present invention provide forming the bottom contact stud 120 with BEOL friendly metals such as, for example, tantalum-nitride (TaN), and/or titanium-nitride (TiN), W, cobalt (Co), other than those costlier high work function metals. More specifically, the bottom contact stud 120 may be formed by depositing the first dielectric layer 210 on top of the contact structure first. Next, using a lithographic patterning and etching process, an opening may be created in the first dielectric layer 210. A depositing process may subsequently be used to fill the opening with conductive materials such as, but not limited to, TaN, TiN, W or Co. Excessive conductive materials deposited on top of the first dielectric layer 210 may be removed through a CMP process, which planarizes the bottom contact stud 120 to have a coplanar top surface with the first dielectric layer 210. The use of TaN, TiN, W or Co instead of costlier high work function metals for the bottom contact stud 120 avoids the waste of high work function metals during the CMP process.

It is to be noted here that embodiments of present invention are not limited in this aspect and the bottom contact stud 120 may be formed in other suitable ways as well. For example, the bottom contact stud 120 may be formed first on top of the bottom contact metal 111 through a patterning and etching process, which would generally cause significant waste of the material that forms the bottom contact stud 120 such as, for example, costlier work function metals if used. The first dielectric layer 210 may be subsequently deposited to surround the bottom contact stud 120.

Figure 2:
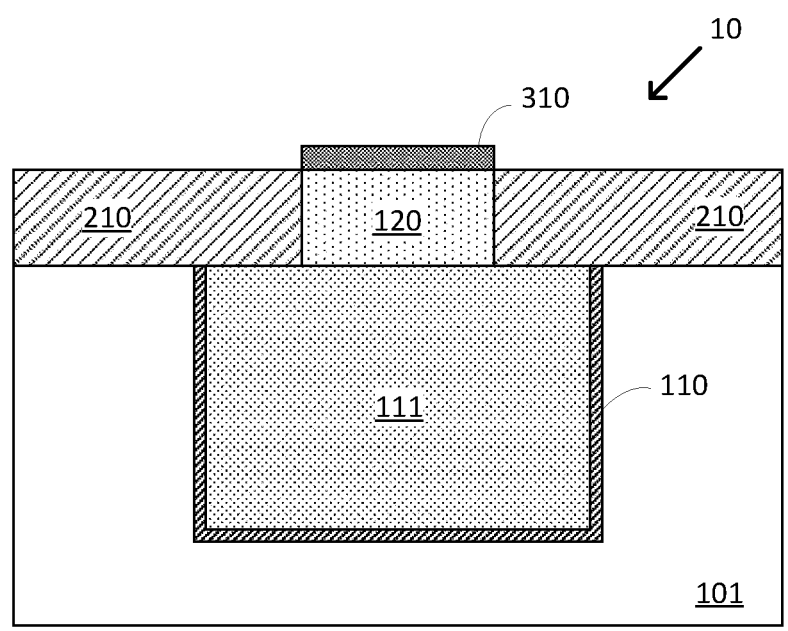

As being demonstratively illustrated in FIG. 2, embodiments of present invention provide forming a bottom electrode 310 of high work function metal on top of the bottom contact stud 120. More particularly, embodiments of present invention provide applying a selective formation process to form or deposit a layer of high work function metal such as ruthenium (Ru), platinum (Pt), or Ni only on top of the bottom contact stud 120 to become the bottom electrode 310. The selective formation process may not form the high work function metal on top of the first dielectric layer 210 that surrounds the bottom contact stud 120, which avoids the waste of these precious high work function metals.

The selective formation process may be, for example, an atomic layer deposition (ALD) process, a chemical vapor deposition (CVD) process, or an electroless plating process and may be tuned and/or conditioned such that high work function metals such as, for example, Ru, Pt, and Ni, may only be deposited on top of certain types of materials such as that of the bottom contact stud 120. The bottom contact stud 120 has a material composition that is different from that of the surrounding first dielectric layer 210, which does not attract the high work function metals. The deposition of the high work function metals only on top of the bottom contact stud 120 saves a significant amount of these metals, which would otherwise be wasted, therefor reducing the overall cost of the device manufacturing.

Because the bottom electrode 310 is only deposited on top of the bottom contact stud 120, the bottom electrode 310 has a bottom surface that is significantly same in size as that of a top surface of the bottom contact stud 120 that is surrounded by the first dielectric layer 210. The bottom electrode 310 may be deposited to have a thickness ranging from about 1 nm to 10 nm. Since the bottom electrode 310 is only formed on top of the bottom contact stud 120, the bottom electrode 310 may also be referred to as a cap or a bottom electrode cap.

Figure 3:
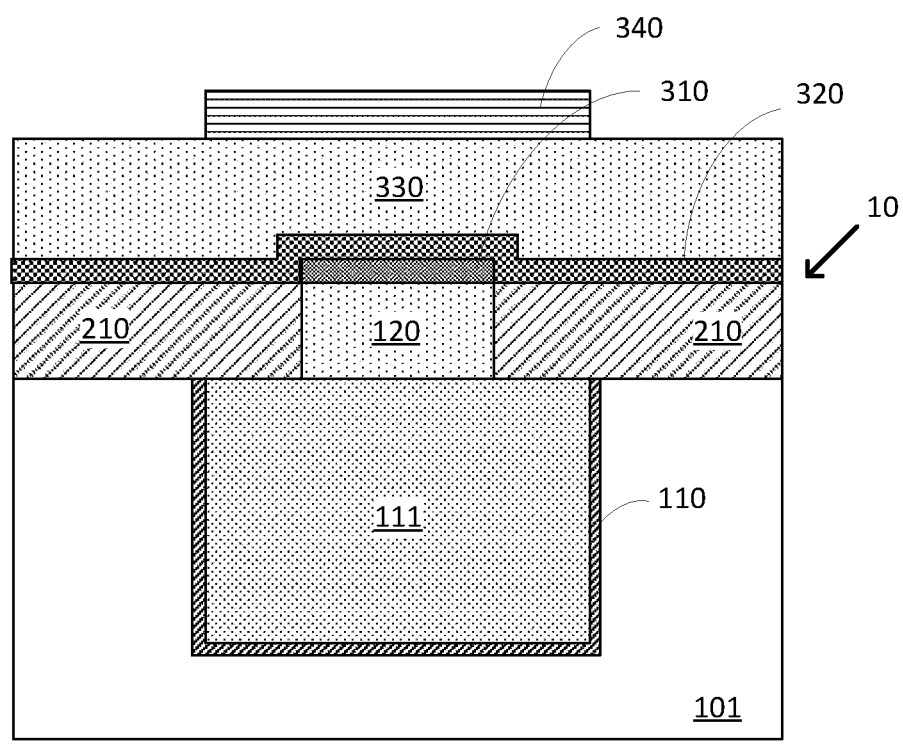

As being demonstratively illustrated in FIG. 3, embodiments of present invention provide forming a blanket metal oxide layer 320 on top of the bottom electrode 310 and the first dielectric layer 210. A blanket top electrode layer 330 may also be formed on top of the blanket metal oxide layer 320. In one embodiment, the blanket metal oxide layer 320 may be, but not limited to, hafnium-oxide (HfOx), zirconium-oxide (ZrOx), hafnium-zirconium-oxide (HfZrOx), titanium-oxide (TiOx), nickel-oxide (NiOx), tantalum-oxide (TaOx), vanadium-oxide (VOx), or copper-oxide (CuOx). The blanket metal oxide layer 320 may be formed through, for example, an ALD process or a CVD process to have a thickness ranging from about 2 nm to 20 nm. The blanket metal oxide layer 320 may serve to form a switching layer of the RRAM cell as being described below in more details.

The blanket top electrode layer 330 may be a layer of Ti, TiN, TaN, W material and in some embodiment may also incorporate the high work function metals such as Ru, Pt, or Ni for enhanced performance but possibly at a higher cost. The blanket top electrode layer 330 may also be formed through the ALD or CVD process to have a thickness ranging from about 5 nm to 100 nm. Following the formation of the blanket metal oxide layer 320 and the blanket top electrode layer 330, embodiments of present invention further provide patterning the blanket metal oxide layer 320 and the blanket top electrode layer 330 into the shape of a RRAM cell. As part of that patterning process, a hard mask 340 may be formed on top of the blanket top electrode layer 330 through, for example, a lithographic patterning and etching process.

Figure 4:
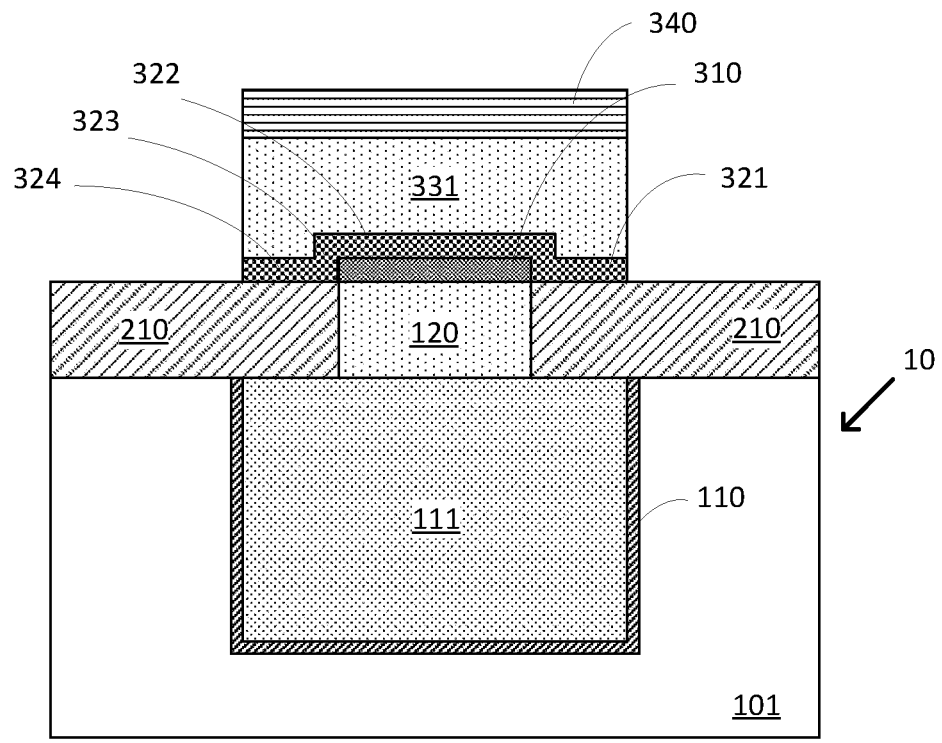

As being demonstratively illustrated in FIG. 4, embodiments of present invention provide using the hard mask 340 in an anisotropic etching process to etch the blanket top electrode layer 330 and the blanket metal oxide layer 320. The anisotropic etching process transforms the blanket top electrode layer 330 into a top electrode 331 and the blanket metal oxide layer 320 into a metal oxide layer 321.

According to one embodiment, the RRAM cell 10 includes a bottom electrode 310 and a metal oxide layer 321, wherein the metal oxide layer 321 includes a central portion 322 that is in direct contact with the bottom electrode 310, a peripheral portion 324 that is nonplanar with the central portion 322, and a vertical portion 323 between the central portion 322 and the peripheral portion 324. The vertical portion 323 of the metal oxide layer 321 surrounds the sidewalls of the bottom electrode 310 and the top electrode 331 is directly adjacent to an outer surface of the vertical portion 323 of the metal oxide layer 321. In other words, the bottom electrode 310 is fully encapsuled by the bottom contact stud 120 and the metal oxide layer 321.

According to another embodiment, the peripheral portion 324 of the metal oxide layer 321 has a bottom surface and the bottom surface of the peripheral portion 324 of the metal oxide layer 321 is coplanar with a bottom surface of the bottom electrode 310.

Figure 5:
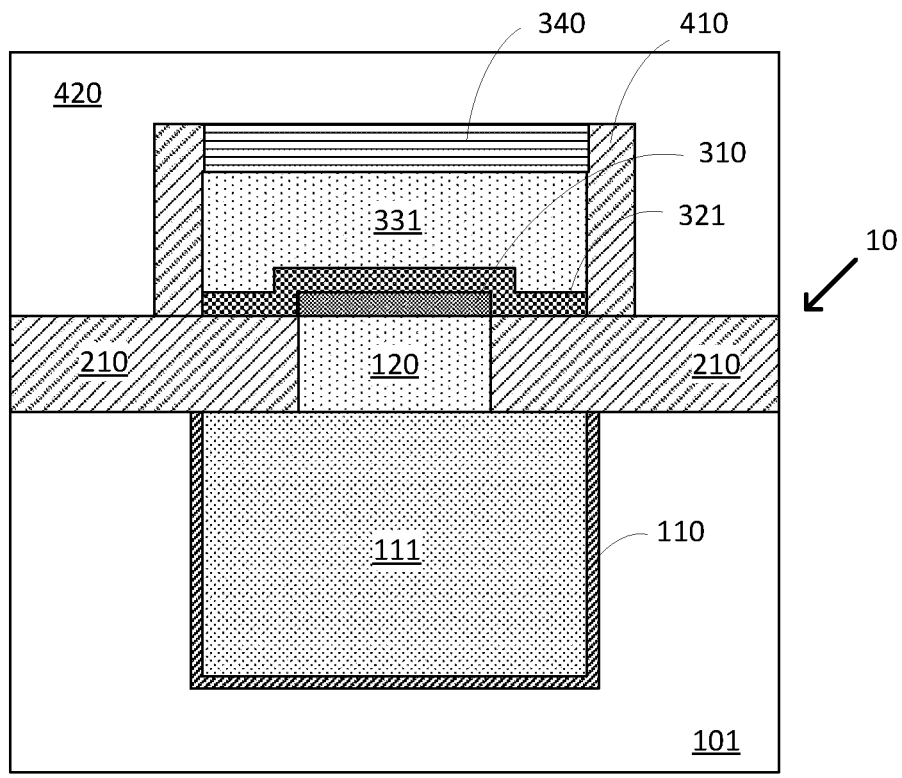

As being demonstratively illustrated in FIG. 5, embodiments of present invention provide forming a second dielectric layer 410 over the RRAM cell 10. The second dielectric layer 410 may be a conformal dielectric layer of SiN or SiCHN material and may be formed to cover the top of the hard mask 340, sidewalls of the hard mask 340, sidewalls of the top electrode metal 331, sidewalls of the metal oxide 321, and the top of the first dielectric layer 210. Subsequently, an anisotropic and directional etching process may be applied to remove horizontal portions of the second dielectric layer 410, which results in the exposure of the hard mask 340 and the first dielectric layer 210, and the formation of the spacer shaped second dielectric layer 410. Embodiments of present invention may further include forming a third dielectric layer 420 covering the exposed hard mask 340, the spacer shaped second dielectric layer 410, and the first dielectric layer 210. The third dielectric layer 420 may be an ILD layer of, but not limited to, SiO, SiO2, SiCO, or SiCOH.

Figure 6:
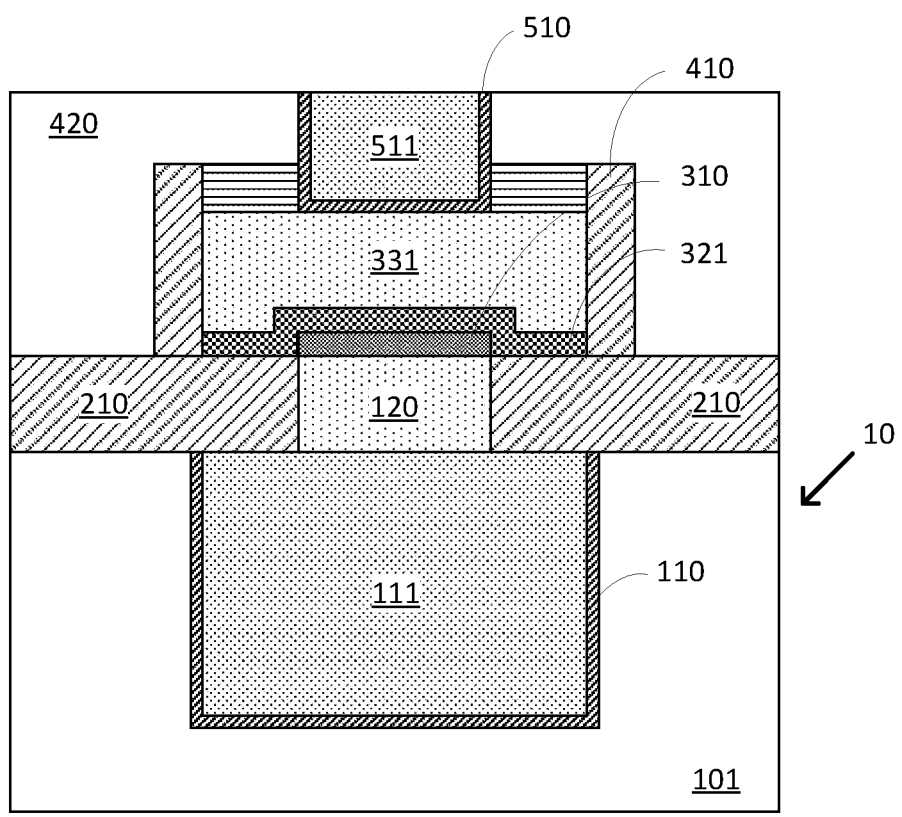

As being demonstratively illustrated in FIG. 6, embodiments of present invention provide forming a top contact 511 in contact with the top electrode 331. The top contact 511 may be formed through first creating an opening through both the third dielectric layer 420 and the second dielectric layer 410 in a lithographic patterning and etching process. Once the opening is created, a liner 510 of lining material may be first deposited inside the opening lining sidewalls and a bottom surface of the opening, and the top contact 511 may then be deposited inside the opening.

FIGS. 7-12 are demonstrative illustrations of cross-sectional views of a RRAM cell in a process of manufacturing thereof according to another embodiment of present invention. More particularly, in forming a RRAM cell 20, embodiments of present invention provide receiving a contact structure such as, for example, the bottom contact metal 111 embedded in a supporting structure such as, for example, the interlevel-dielectric (ILD) layer 101 on top of a semiconductor substrate (not shown). The bottom contact metal 111, the liner 110, and the ILD layer 101 may be the same as those described above with reference to FIG. 1 in connection with the formation of the RRAM cell 10.

Figure 7:
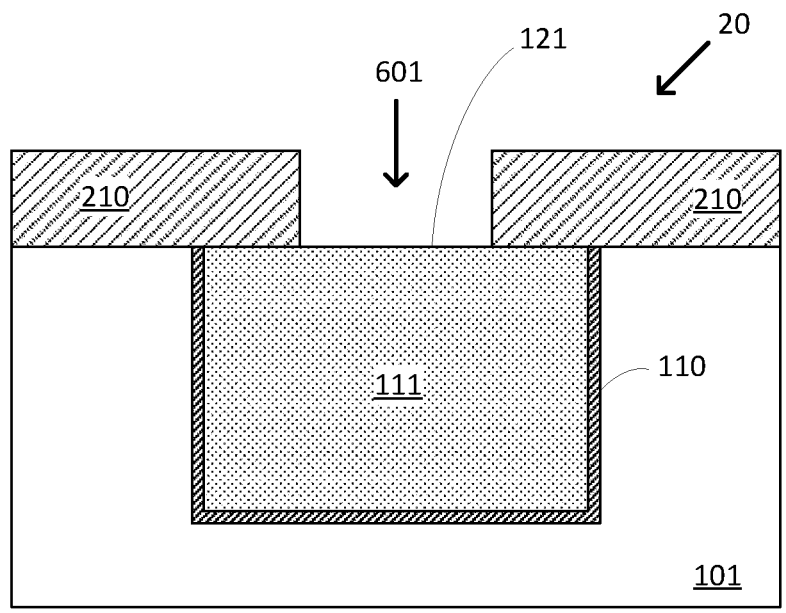
FIGS. 7-12 are demonstrative illustrations of cross-sectional views of a RRAM cell in a process of manufacturing thereof according to another embodiment of present invention.

As being demonstratively illustrated in FIG. 7, embodiments of present invention provide forming a first dielectric layer 210 on top of the bottom contact metal 111 and the ILD layer 101. In one embodiment, the first dielectric layer 210 may be silicon-nitride (SiN), silicon-carbon-nitride (SiCN, SiCHN) or a combination of SiN/SiCHN, and may be formed to have a thickness ranging from about 10 to 100 m. Embodiments of present invention further provide creating an opening 601 inside the first dielectric layer 210 through a lithographic patterning and etching process. The opening 601 may expose a contact area 121 of a top surface of the bottom contact metal 111.

Figure 8:
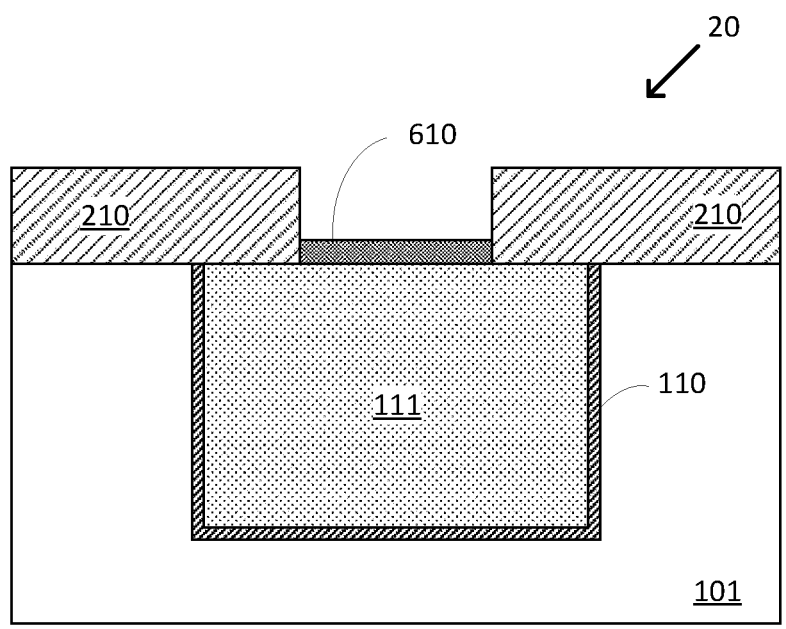

As being demonstratively illustrated in FIG. 8, embodiments of present invention provide forming a bottom electrode 610 of high work function metal directly on the contact area 121 of the top surface of the bottom contact metal 111. More particularly, embodiments of present invention provide applying a selective formation process to form or deposit a layer of high work function metal such as Ru, Pt, or Ni only on top of the contact area 121 to become the bottom electrode 610. The selective formation process may not form the high work function metal on top of the first dielectric layer 210 that surrounds the opening 601 thereby saving the material cost of the manufacturing. In other words, only the amount of high work function metal that needs to fill the bottom portion of the opening 601 is needed resulting in significant savings in the amount of high work function metal.

The selective formation process may be, for example, an atomic layer deposition (ALD) process, a chemical vapor deposition (CVD) process, or an electroless plating process with the process parameters be specially tuned and/or conditioned such that high work function metals such as, for example, Ru, Pt, and Ni may only be deposited on top of certain materials such as those of the contact area 121 and not on top of the material of the surrounding first dielectric layer 210. The deposition on top of the bottom contact stud 120 saves a significant amount of the high work function metals. The bottom electrode 610 may be deposited to have a thickness ranging from 2 nm to 20 nm, as compared with the thickness of the first dielectric layer 210 of about 10 nm to 100 nm. By forming the bottom electrode 610 to have a thickness that is less than the depth of the opening 601 or the thickness of the first dielectric layer 210, embodiments of present invention provide a significant saving of the high work function metal using in forming the bottom electrode 610.

Figure 9:
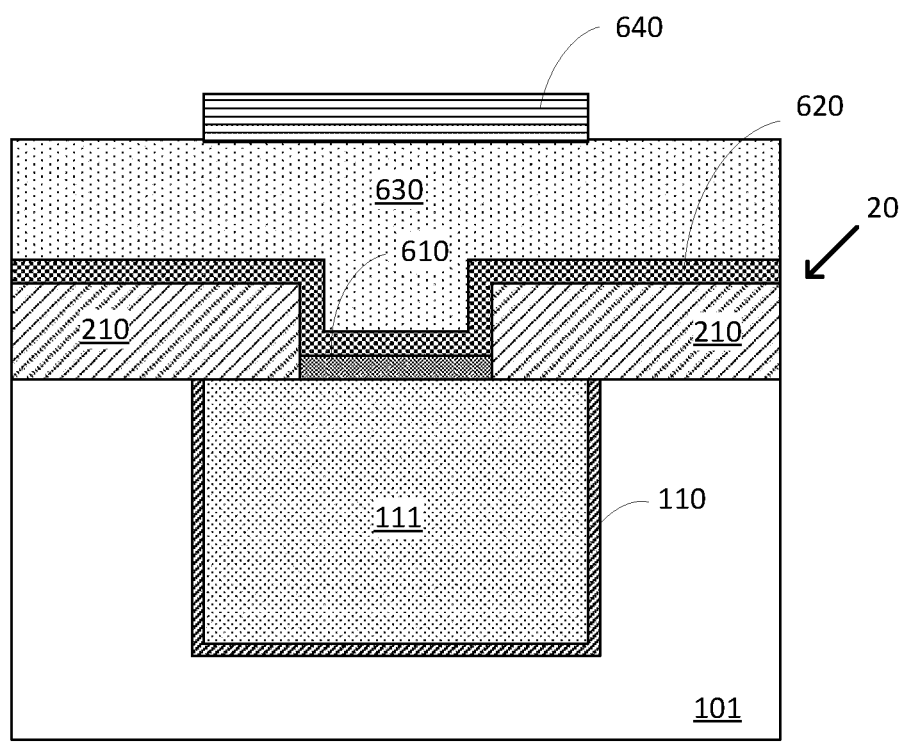

As being demonstratively illustrated in FIG. 9, embodiments of present invention provide forming a blanket metal oxide layer 620 on top of the bottom electrode 610 and the first dielectric layer 210 and forming a blanket top electrode layer 630 on top of the blanket metal oxide layer 620. As in forming the RRAM cell 10, the blanket metal oxide layer 620 may be, but not limited to, HfOx, ZrOx, HfZrOx, TiOx, NiOx, TaOx, VOx, or CuOx. The blanket metal oxide layer 620 may be used to form a metal oxide layer 621 (see FIG. 10) serving as a switching layer of the RRAM cell 20. The blanket metal oxide layer 620 may be formed to have a thickness ranging from about 2 nm to 20 nm.

The blanket top electrode layer 630 may be a layer of Ti, TiN, TaN, W and in some embodiment may also incorporate high work function metals such as Ru, Pt, or Ni for enhanced device performance. Embodiments of present invention further provide patterning the blanket metal oxide layer 620 and the blanket top electrode layer 630 into the shape of a RRAM cell. As part of that patterning step, a hard mask 640 may be formed on top of the blanket top electrode layer 630 through, for example, a lithographic patterning and etching process.

Figure 10:
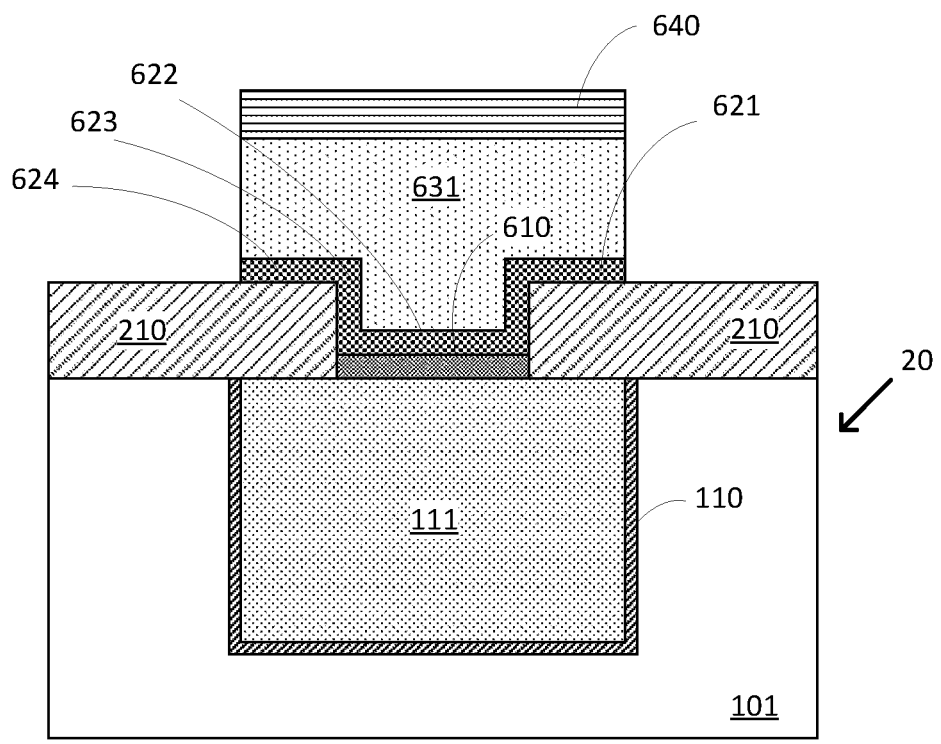

As being demonstratively illustrated in FIG. 10, embodiments of present invention provide using the hard mask 640 in an anisotropic etching process to etch the blanket top electrode layer 630 and the blanket metal oxide layer 620. The anisotropic etching process transforms the blanket top electrode layer 630 into a top electrode 631 and the blanket metal oxide layer 620 into a metal oxide layer 621.

According to one embodiment, the RRAM cell 20 includes a bottom electrode 610 and a metal oxide layer 621, wherein the metal oxide layer 621 includes a central portion 622 that is in direct contact with the bottom electrode 610, a peripheral portion 624 that is nonplanar with the central portion 622, and a vertical portion 623 between the central portion 622 and the peripheral portion 624. An outer surface of the vertical portion 623 of the metal oxide layer 621 is directly adjacent to and surrounded by the first dielectric layer 210. In the meantime, at least a lower portion of the top electrode 631 is directly adjacent to and in contact with an inner surface of the vertical portion 623 of the metal oxide layer 621. In other words, the lower portion of the top electrode 631 is surrounded by the vertical portion 623 of the metal oxide layer 621 and horizontally surrounded by the first dielectric layer 210.

The bottom electrode 610 has a thickness ranging from 2 nm to 20 nm, the metal oxide layer 621 has a thickness from 2 nm to 20 nm, and the first dielectric layer 210 has a thickness ranging from 10 nm to 100 nm. As is illustrated in FIG. 10, the peripheral portion 624 of the metal oxide layer 621 is above the first dielectric layer 210 and the central portion 622 of the metal oxide layer 621 is below a top surface of the first dielectric layer 210.

Figure 11:
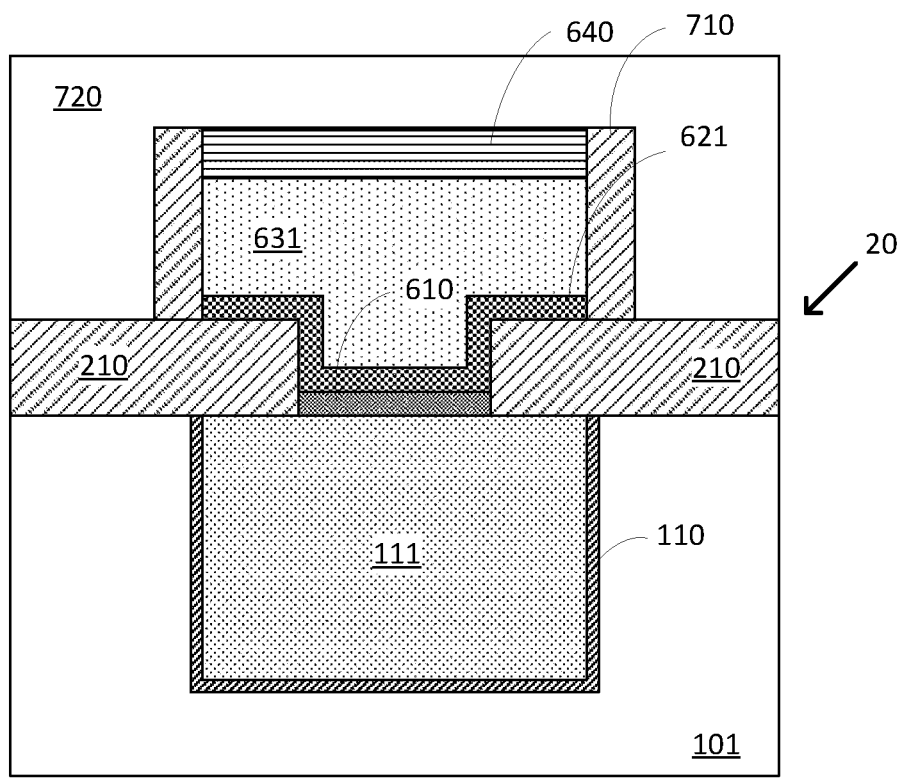

As being demonstratively illustrated in FIG. 11, embodiments of present invention provide forming a second dielectric layer 710 over the RRAM cell 10. The second dielectric layer 710 may be a conformal dielectric layer of SiN or SiCHN material and may be formed to cover the top of the hard mask 640, sidewalls of the hard mask 640, sidewalls of the top electrode metal 631, sidewalls of the metal oxide 621, and the top of the first dielectric layer 210. Subsequently, an anisotropic and directional etching process may be applied to remove horizontal portions of the second dielectric layer 610, which results in the exposure of the hard mask 640 and the first dielectric layer 210, and the formation of the spacer shaped second dielectric layer 710. Embodiments of present invention may further include forming a third dielectric layer 720 covering the exposed hard mask 640, the spacer shaped second dielectric layer 710, and the first dielectric layer 210. The third dielectric layer 720 may be an ILD layer of, but not limited to, SiO, SiO2, SiCO, or SiCOH.

Figure 12:
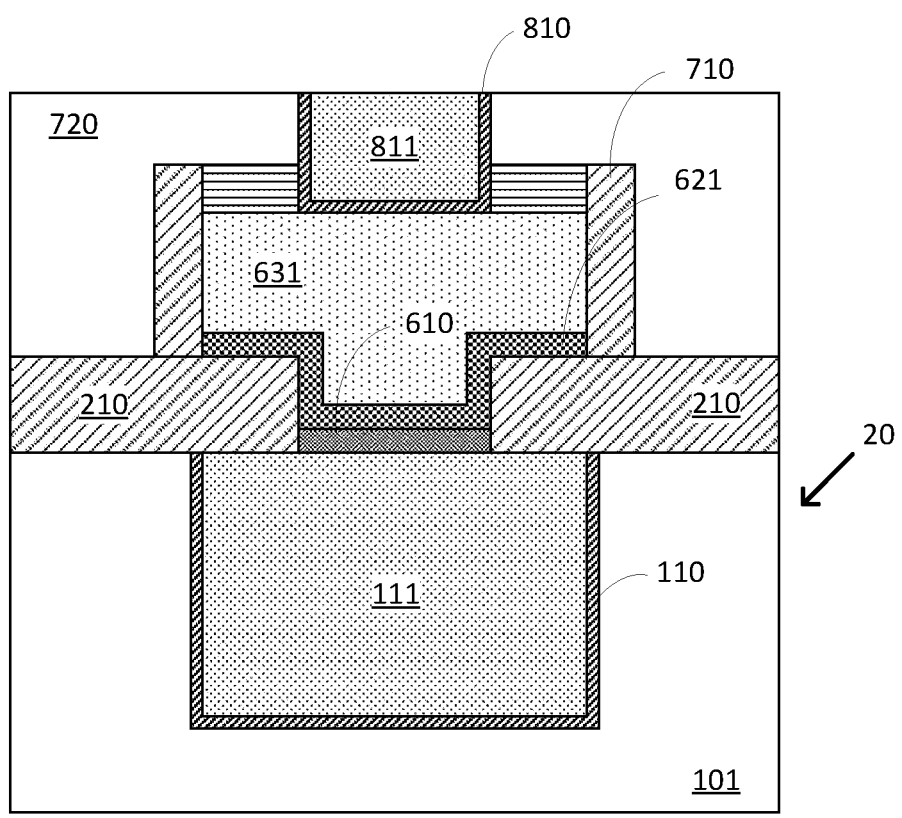

As being demonstratively illustrated in FIG. 12, embodiments of present invention provide forming a top contact 811 in contact with the top electrode 631. The top contact 811 may be formed through first creating an opening through both the third dielectric layer 720 and the second dielectric layer 710 in a lithographic patterning and etching process. Once the opening is created, a liner 810 of lining material may be first deposited inside the opening lining sidewalls and a bottom surface of the opening, and the top contact 811 may then be deposited inside the opening.

Figure 13:
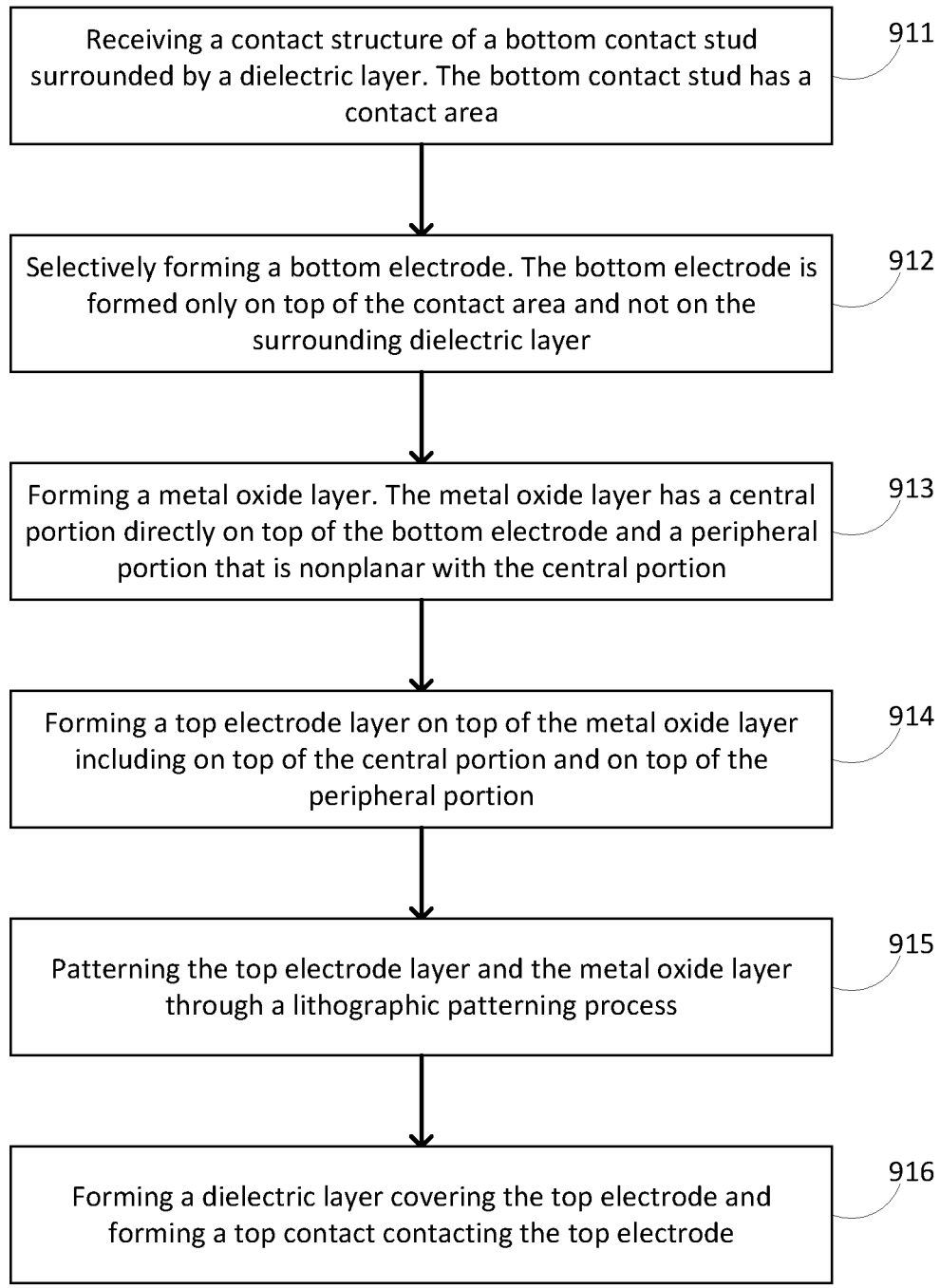
FIG. 13 is a demonstrative illustration of a flow-chart of a method of manufacturing a RRAM cell according to one embodiment of present invention.

FIG. 13 is a demonstrative illustration of a flow-chart of a method of manufacturing a RRAM cell according to one embodiment of present invention. The method includes (911) receiving a contact structure of a bottom contact stud surrounded by a dielectric layer, wherein the bottom contact stud has a contact area; (912) selectively forming a bottom electrode, wherein the bottom electrode is formed only on top of the contact area and not on the surrounding dielectric layer, through for example a selective growing process; (913) forming a metal oxide layer above the bottom electrode, wherein the metal oxide layer has a central portion directly on top of and in contact with the bottom electrode and a peripheral portion that is nonplanar with the central portion; (914) forming a top electrode layer on top of the metal oxide layer including on top of the central portion and on top of the peripheral portion; (915) patterning the top electrode layer and the metal oxide layer, through for example a lithographic patterning process; and (916) forming a dielectric layer covering the top electrode and forming a top contact in contact with the top electrode.

Figure 14:
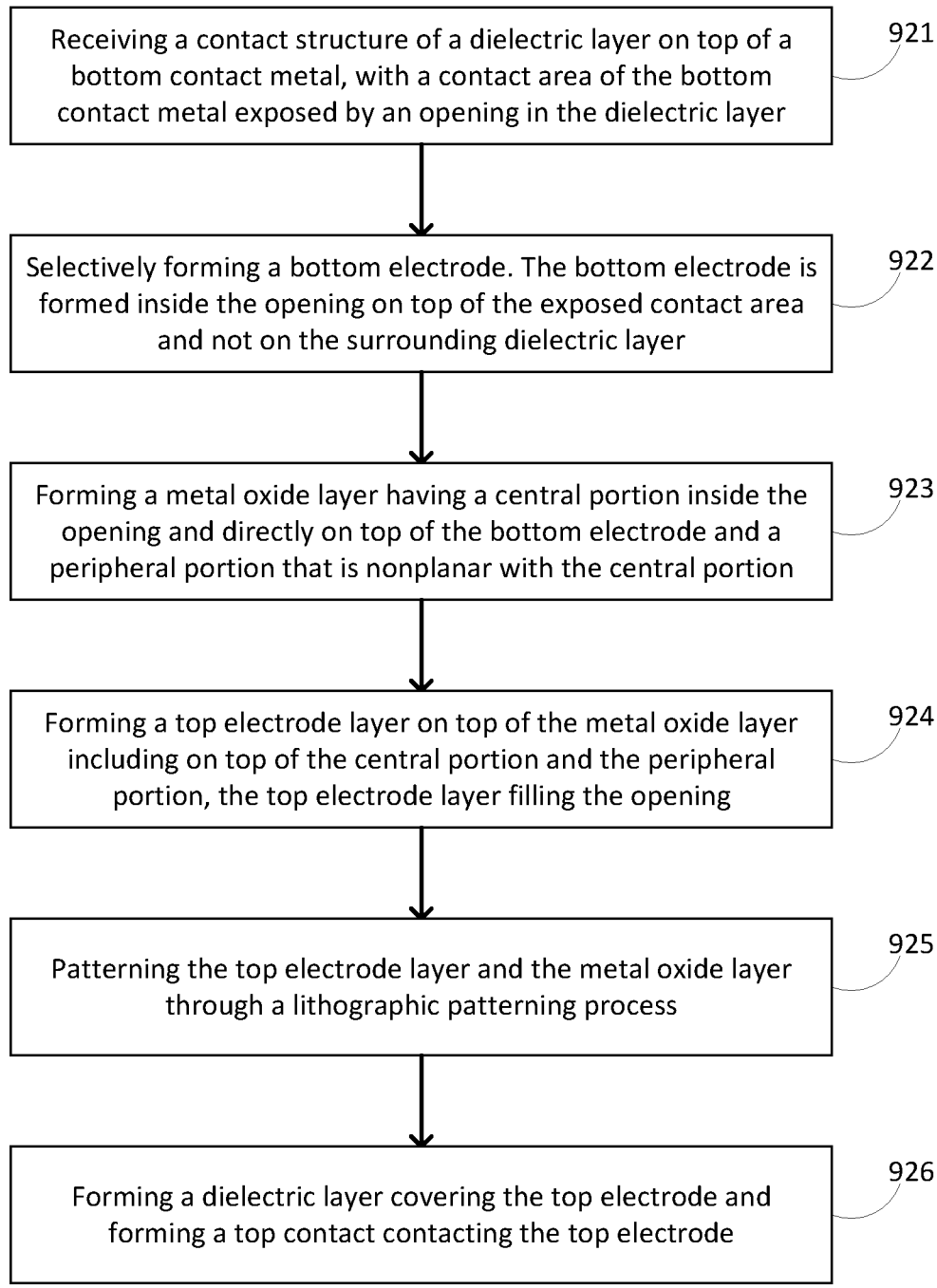
FIG. 14 is a demonstrative illustration of a flow-chart of a method of manufacturing a RRAM cell according to another embodiment of present invention.

FIG. 14 is a demonstrative illustration of a flow-chart of a method of manufacturing a RRAM cell according to another embodiment of present invention. The method includes (921) receiving a contact structure of a dielectric layer on top of a bottom contact metal, with a contact area of the bottom contact metal exposed by an opening in the dielectric layer; (922) selectively forming a bottom electrode, wherein the bottom electrode is formed inside the opening on top of the exposed contact area and not on the surrounding dielectric layer, through for example a selective growing process; (923) forming a metal oxide layer above the bottom electrode, wherein the metal oxide layer has a central portion inside the opening, directly on top of, and in contact with the bottom electrode and a peripheral portion that is nonplanar with the central portion; (924) forming a top electrode layer on top of the metal oxide layer including on top of the central portion and on top of the peripheral portion, wherein the top electrode layer filling the opening; (925) patterning the top electrode layer and the metal oxide layer, through for example a lithographic patterning process; and (926) forming a dielectric layer covering the top electrode and forming a top contact in contact with the top electrode.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A resistive random-access memory (RRAM) cell comprising:
   a bottom electrode;
   a metal oxide layer, the metal oxide layer having a central portion that is in direct contact with the bottom electrode, a peripheral portion that is nonplanar with the central portion, and a vertical portion between the central portion and the peripheral portion;
   a top electrode directly above the metal oxide layer; and
   a dielectric layer, wherein an outer surface of the vertical portion of the metal oxide layer is directly adjacent to the dielectric layer.

2. The RRAM cell of claim 1, wherein the bottom electrode has a top surface, a bottom surface, and a sidewall between the top surface and the bottom surface, the sidewall of the bottom electrode being surrounded by the dielectric layer.

3. The RRAM cell of claim 1, wherein the top electrode is on top of the central portion and the peripheral portion of the metal oxide layer and directly adjacent to an inner surface of the vertical portion of the metal oxide layer.

4. The RRAM cell of claim 1, wherein the bottom electrode has a first thickness and the dielectric layer has a second thickness, and wherein the first thickness is less than the second thickness.

5. The RRAM cell of claim 4, wherein a portion of the top electrode is in direct contact with an inner surface of the vertical portion of the metal oxide layer and is horizontally surrounded by the dielectric layer.

6. The RRAM cell of claim 5, wherein the peripheral portion of the metal oxide layer is directly above the dielectric layer and the central portion of the metal oxide layer is at a level below a top surface of the dielectric layer.

7. A resistive random-access memory (RRAM) cell comprising:
   a bottom electrode;
   a metal oxide layer, the metal oxide layer having a central portion that is in direct contact with the bottom electrode, a peripheral portion that is nonplanar with the central portion, and a vertical portion between the central portion and the peripheral portion;
   a top electrode directly above the metal oxide layer;
   a dielectric layer underneath the peripheral portion of the metal oxide layer; and
   a bottom contact stud surrounded by the dielectric layer and in direct contact with the bottom electrode,
   wherein the bottom electrode and the bottom contact stud have a same contact area.

8. The RRAM cell of claim 7, wherein the bottom electrode is fully encapsuled by the bottom contact stud and the metal oxide layer.

9. The RRAM cell of claim 7, wherein the central portion of the metal oxide layer is at a level above a top surface of the dielectric layer.

10. The RRAM cell of claim 7, wherein a portion of the top electrode is in direct contact with an outer surface of the vertical portion of the metal oxide layer.

11. A method of forming a semiconductor structure comprising:
- receiving a contact structure having a contact area;
- forming a bottom electrode on top of the contact area;
- forming a metal oxide layer, the metal oxide layer having a central portion directly above and in contact with the bottom electrode and a peripheral portion above a dielectric layer, wherein the peripheral portion of the metal oxide layer is nonplanar with the central portion of the metal oxide layer;
- forming a top electrode layer above the metal oxide layer; and
- patterning the top electrode layer and the metal oxide layer,
- wherein the dielectric layer is above the contact structure and has an opening exposing the contact area of the contact structure, wherein forming the bottom electrode comprises selectively forming the bottom electrode on top of the exposed contact area inside the opening, the bottom electrode being surrounded by the dielectric layer.

12. The method of claim 11, wherein forming the metal oxide layer comprises forming the central portion of the metal oxide layer directly on top of the bottom electrode inside the opening and the peripheral portion of the metal oxide on top of the dielectric layer outside the opening.

\* \* \* \* \*